United States Patent
Ishikura et al.

(10) Patent No.: US 9,741,663 B2
(45) Date of Patent: Aug. 22, 2017

(54) SEMICONDUCTOR DEVICE AND MANUFACTURING METHOD THEREOF

(71) Applicant: KABUSHIKI KAISHA TOSHIBA, Minato-ku, Tokyo (JP)

(72) Inventors: Taishi Ishikura, Kuwana Mie (JP); Atsunobu Isobayashi, Yokkaichi Mie (JP); Tatsuro Saito, Yokkaichi Mie (JP); Akihiro Kajita, Yokkaichi Mie (JP); Tadashi Sakai, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/067,140

(22) Filed: Mar. 10, 2016

(65) Prior Publication Data

US 2017/0069576 A1  Mar. 9, 2017

(30) Foreign Application Priority Data

Sep. 4, 2015 (JP) .................................. 2015-174923

(51) Int. Cl.
*H01L 21/00* (2006.01)
*H01L 23/532* (2006.01)
*H01L 21/768* (2006.01)

(52) U.S. Cl.
CPC .. *H01L 23/53276* (2013.01); *H01L 21/76871* (2013.01); *H01L 21/76892* (2013.01)

(58) Field of Classification Search
CPC ......... H01L 23/53276; H01L 23/53209; H01L 21/76871
See application file for complete search history.

(56) References Cited

U.S. PATENT DOCUMENTS

| 8,648,464 | B2* | 2/2014 | Kitamura | H01L 21/02491 257/750 |
| 9,484,206 | B2* | 11/2016 | Ishikura | H01L 23/544 |
| 2011/0006425 | A1* | 1/2011 | Wada | H01L 21/76807 257/750 |
| 2013/0056873 | A1* | 3/2013 | Wada | H01L 23/5226 257/746 |
| 2014/0084250 | A1* | 3/2014 | Wada | H01L 23/53276 257/29 |

(Continued)

FOREIGN PATENT DOCUMENTS

| JP | 2012054303 A | 3/2012 |
| JP | 2016174039 A | 9/2016 |

OTHER PUBLICATIONS

Azad Naeemi, et al., "Conductance Modeling for Graphene Nanoribbon (GNR) Interconnects", IEEE Electron Device Letters, vol. 28, No. 5, May 2007, pp. 428-431.

(Continued)

*Primary Examiner* — Laura Menz
(74) *Attorney, Agent, or Firm* — Holtz, Holtz & Volek PC

(57) ABSTRACT

According to one embodiment, a semiconductor device includes an underlayer formed on a substrate, a catalyst layer disposed on the underlayer and extending in an interconnect length direction. The device further includes an upper graphene layer formed on an upper face of the catalyst layer, and side graphene layers provided on two respective side faces of the catalyst layer, the two side faces extending in the interconnect length direction.

17 Claims, 12 Drawing Sheets

(56) References Cited

U.S. PATENT DOCUMENTS

2016/0276219 A1* 9/2016 Wada ................ H01L 21/76834
2016/0372528 A1* 12/2016 Kamura .............. H01L 51/0096
2017/0062345 A1* 3/2017 Saito ................ H01L 23/53276
2017/0069576 A1* 3/2017 Ishikura ............ H01L 23/53276

OTHER PUBLICATIONS

Mitsutaka Fujita, et al., "Peculiar Localized State at Zigzag Graphite Edge", Journal of the Physical Society of Japan, vol. 65, No. 7, Jul. 1996, pp. 1920-1923.
Related U.S. Appl. No. 14/841,333, Title: "Semiconductor Device and Method of Manufacturing the Same", First Named Inventor Makoto Wada; Filed: Aug. 31, 2015.

* cited by examiner

SEMICONDUCTOR DEVICE AND MANUFACTURING METHOD THEREOF

CROSS-REFERENCE TO RELATED APPLICATIONS

This application is based upon and claims the benefit of priority from Japanese Patent Application No. 2015-174923, filed Sep. 4, 2015, the entire contents of which are incorporated herein by reference.

FIELD

Embodiments described herein relate generally to a semiconductor device and a manufacturing method thereof.

BACKGROUND

Graphene sheets are a novel carbon material exhibiting quantized conduction (ballistic conduction) in the same manner as carbon nanotubes, and are attracting attention as a next-generation technology for fabricating low-resistance interconnects to replace metal interconnects. Because the mean free path of electrons in a graphene sheet is very long, that is, about 100 nm to 1 μm, graphene sheets are highly advantageous in electrical conduction in a long interconnect. A graphene sheet is formed on an exposed face of a catalyst layer by CVD or the like. Because an edge portion of a graphene sheet has the lowest electrical resistance in the graphene sheet, a method for forming a plurality of edges in a graphene sheet is required.

DETAILED DESCRIPTION

In general, according to one embodiment, a semiconductor device includes an underlayer formed on a substrate, a catalyst layer disposed on the underlayer and extending in an interconnect length direction. The device further includes an upper graphene layer formed on an upper face of the catalyst layer; and side graphene layers provided on two respective side faces of the catalyst layer, the two side faces extending in the interconnect length direction.

Embodiments will be explained hereinafter with reference to drawings.

First Embodiment

Figure 1:
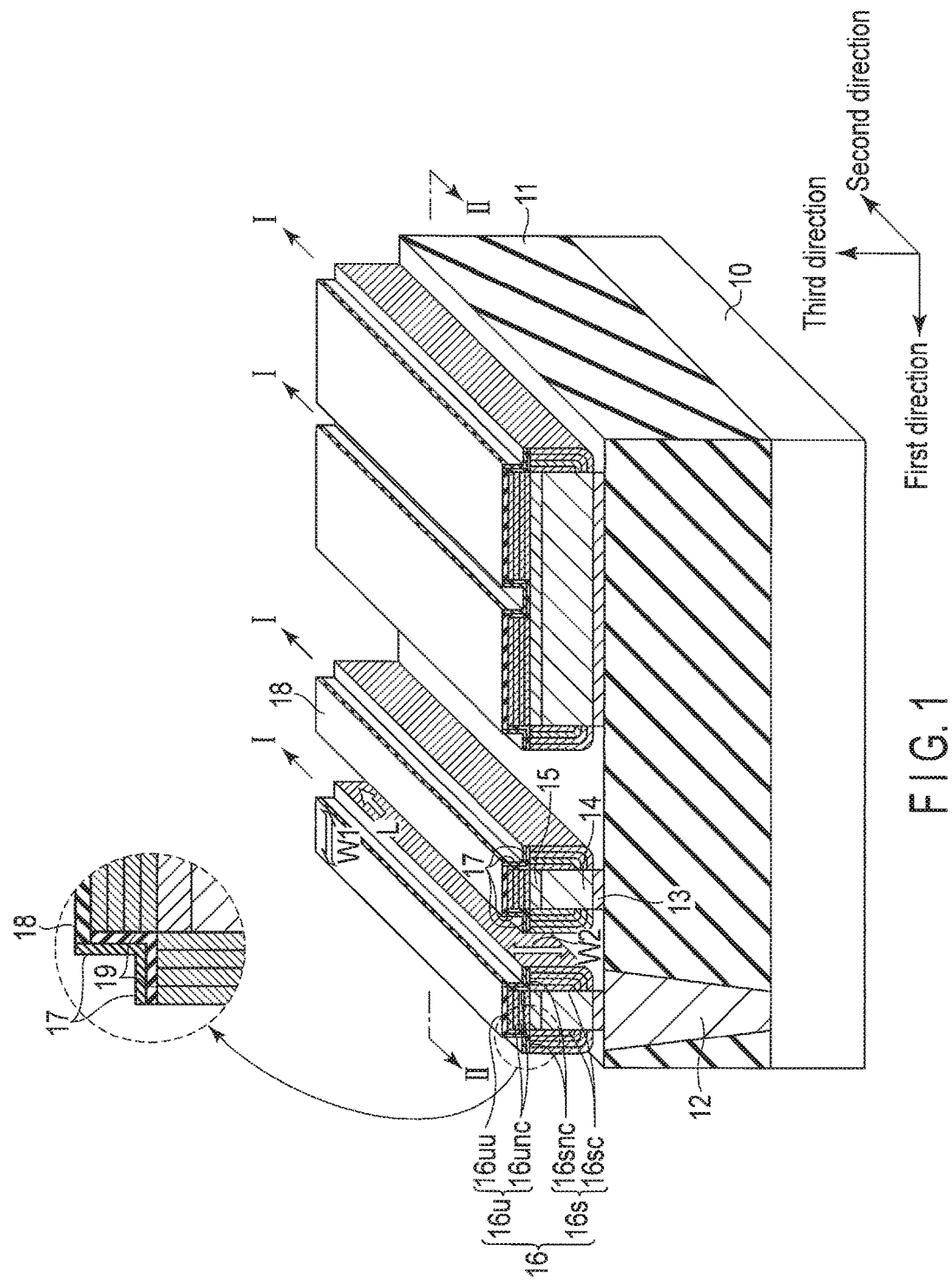
FIG. 1 is a perspective view illustrating a schematic structure of a semiconductor device according to a first embodiment.
Figure 2:
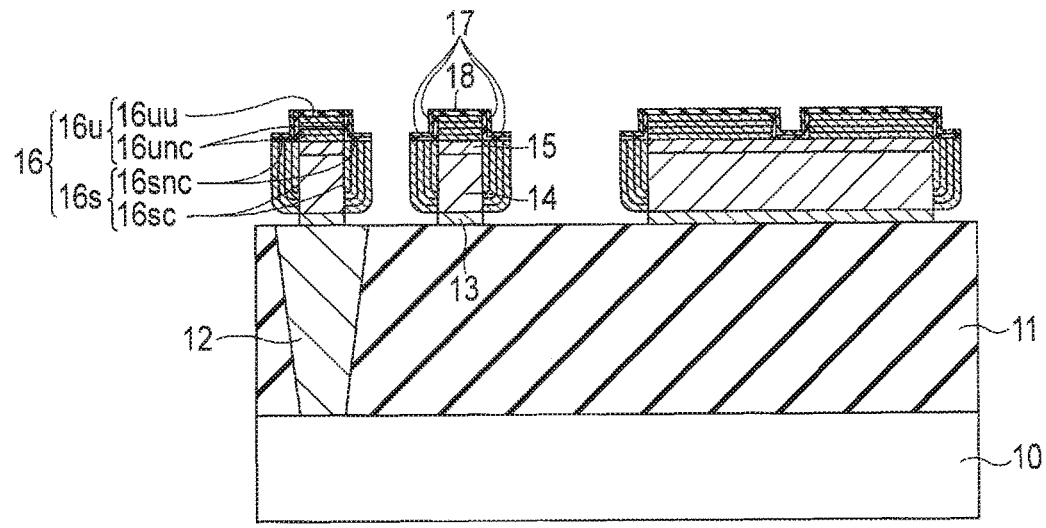
FIG. 2 is a cross-sectional view taken along line II-II of FIG. 1.

FIG. 1 is a perspective view illustrating a schematic structure of a semiconductor device according to a first embodiment. FIG. 2 is a cross-sectional view taken along line II-II of FIG. 1.

As illustrated in the drawings, the semiconductor device according to the first embodiment includes a semiconductor substrate 10 on which semiconductor elements such as transistors and capacitors are formed, an underlayer 11 formed on the semiconductor substrate 10, a first contact via 12 that is embedded and formed in the underlayer 11, a liner layer 13 that is formed on the underlayer 11, a catalyst layer 14 that is formed on the liner layer 13, a mask layer 15 that is formed on an upper face of the catalyst layer 14, an upper graphene layer 16u that is formed on an upper face of the mask layer 15, and side graphene layers 16s formed on the both respective side faces of the catalyst layer 14. The side graphene layers 16s are formed on the two respective side faces of the catalyst layer 14 that extend in an L-direction. Specifically, one catalyst layer 14 is provided with two side graphene layers 16s.

The catalyst layer 14 has a bottom face located on the side of the underlayer 11 and the liner layer 13, an upper face opposed to the bottom face, and two side faces extending along the interconnect length direction L (second direction orthogonal to a first direction). The catalyst layer 14 has a height in the interconnect height direction W2 (third direction orthogonal to the first and the second directions). The height of the catalyst layer 14 has an influence on the height of the graphene layer 16. The catalyst layer 14 has the upper face on which the upper graphene layer 16u is formed, and the two side faces on which the side graphene layers 16s are formed. None of the three faces contact the underlayer 11 or the liner layer 13. Only the bottom face of the catalyst layer 14 contacts the underlayer 11 and the liner layer 13.

In the drawings, the catalyst layer 14 is a pillar, and the length of the upper face of the catalyst layer 14 is substantially equal to the length of the bottom face of the catalyst layer 14 in the interconnect width direction W1 (first direction). For this reason, the two side faces extending in the L-direction of the catalyst layer 14 are parallel to each other (W2 direction). The catalyst layer 14 is not limited to such a configuration, but may be a rectangle, a circle, or a polygon, for example, or may take the form of a hollow cylindrical structure or a layered structure.

The material of the catalyst layer 14 is preferably simple metal such as cobalt (Co), nickel (Ni), iron (Fe), ruthenium (Ru), and copper (Cu), or an alloy or a carbide containing one or more of these elements. Otherwise, the catalyst layer 14 may have a layered structure in which layers containing these materials are stacked. The thickness of the catalyst layer 14 is preferably 0.5 nm or more, to prevent discontinuous formation of the graphene layer 16.

The graphene layer 16 includes one or more upper graphene layer 16u, and two or more side graphene layers 16s. The upper graphene layer 16u and the side graphene layers 16s are layers that are cut out of one graphene layer 16, and include the same material. In addition, each of the upper graphene layer 16u and the side graphene layers 16s has a layered structure in which single-layer graphene sheets are stacked, and each of them functions as an interconnect.

Among the side faces of the upper graphene layer 16u, each of two side faces extending along the L-direction includes an edge face (catalyst-noncontacting edge face) 16*unc* of the graphene layer 16 that does not contact the catalyst layer 14. Neither of the two catalyst-noncontacting edge faces 16*unc* of the upper graphene layer 16*u* contacts the catalyst layer 14. Each non-catalyst-contacting edge face 16*unc* includes edges of the single-layer graphene sheets included in the upper graphene layer 16*u*.

An upper face of each of the side graphene layers 16*s* that does not contact the catalyst layer 14 includes an edge face (catalyst-noncontacting edge face) 16*snc* of the graphene layer 16 that does not contact the catalyst layer 14. In addition, a side face of each of the side graphene layers 16*s* that contacts the catalyst layer 14 includes an edge face (catalyst-contacting edge face) 16*sc* of the graphene layer 16 that contacts the catalyst layer 14.

Specifically, each of the side graphene layers 16*s* is provided with a catalyst-contacting edge face 16*sc* and a catalyst-noncontacting edge face 16*snc*. Each of the catalyst-noncontacting edge face 16*snc* and the catalyst-contacting edge face 16*sc* includes edges of respective single-layer graphene sheets included in the side graphene layer 16*s*.

In each of the side graphene layers 16*s*, each of the single-layer graphene sheets is formed to have an L-shape from the catalyst-contacting edge face 16*sc* side to the catalyst-noncontacting edge face 16*snc* side. Specifically, the side including the catalyst-contacting edge face 16*sc* and extending in the W1 direction is connected with the side including the catalyst-noncontacting edge face 16*snc* and extending in the W2 direction to form an L-shape.

To increase the connection area with a contact via 20 described later, the catalyst-noncontacting edge face 16*unc* of the upper graphene layer 16*u* preferably has a small distance from the catalyst-noncontacting edge face 16*snc* of each side graphene layer 16*s*. In addition, the height (W2 direction) of the catalyst-noncontacting edge face 16*unc* of the upper graphene layer 16*u* is preferably equal to the width (W1 direction) of the catalyst-noncontacting edge face 16*snc* of each side graphene layer 16*s*. It is also preferable that the length (L-direction) of the catalyst-noncontacting edge face 16*unc* of the upper graphene layer 16*u* is preferably equal to the length (L-direction) of the catalyst-noncontacting edge face 16*snc* of each side graphene layer 16*s*.

Generally, because a localized electron state exists at edges of a graphene sheet, quantized conduction (ballistic conduction) more easily occurs at edges of a graphene sheet than in other portions of a graphene sheet, and edges of a graphene sheet have a very low electrical resistance. For this reason, the electrical resistance becomes lower as the number of edges of a graphene sheet increases. Because the catalyst-noncontacting edge faces 16*unc* and 16*snc* of the upper graphene layer 16*u* and the side graphene layers 16*s* include many edges of graphene sheets, the catalyst-noncontacting edge faces 16*unc* and 16*snc* have a very low electrical resistance and serve as low-resistance conduction paths.

In the structure illustrated in the drawings, at least four catalyst-noncontacting edge faces 16*unc* and 16*snc* are obtained from one graphene layer 16 formed on one catalyst layer 14.

The graphene layer 16 including a plurality of edges of graphene sheets as described above has a lower electrical resistance than does a graphene sheet that does not include a plurality of edges of graphene sheet. This structure reduces the height (W2 direction) of the graphene layer 16.

The liner layer 13 is an auxiliary layer to improve the crystallinity of the catalyst layer 14. The liner layer 13 increases adhesion between the catalyst layer 14 and the graphene layer 16, and enables the graphene layer 16 to uniformly grow on the catalyst layer 14. The liner layer 13 also prevents metal included in the catalyst layer 14 from diffusing into the underlayer 11 and the contact via 12. The material of the liner layer 13 is, for example, tantalum (Ta), titanium (Ti), ruthenium (Ru), tungsten (W), aluminum (Al), or a nitride (such as tantalum nitride (TaN) or a oxide containing these elements. The liner layer 13 may have a structure in which layers containing these materials are stacked.

An edge seal layer 17 is provided on the catalyst-noncontacting edge faces 16*unc* and 16*snc* of the upper graphene layer 16*u* and the side graphene layers 16*s*. The edge seal layer 17 prevents intercalants from separating from the catalyst-noncontacting edge faces 16*unc* and 16*snc* of the upper graphene layer 16*u* and the side graphene layers 16*s*. The edge seal layer 17 is, for example, a silicon oxide film, or a silicon nitride film.

The uppermost face 16*uu* of the upper graphene layer 16*u* is covered with a face seal layer 18. The face seal layer 18 prevents the intercalants from separating from the uppermost face 16*uu* of the upper graphene layer 16*u*. The face seal layer 18 is, for example, a silicon oxide film, or a silicon nitride film.

In addition, as indicated in a broken line in FIG. 1, a modifying layer 19 may be provided on the catalyst-noncontacting edge faces 16*unc* and 16*snc* of the upper graphene layer 16*u* and the side graphene layers 16*s*. The modifying layer 19 modifies (edge face processing) the catalyst-noncontacting edge faces 16*unc* and 16*snc*, to dope intercalants into the upper graphene layer 16*u* and the side graphene layers 16*s*. Because the modifying layer 19 modifies edges of the graphene sheets included in the catalyst-noncontacting edge faces 16*unc* and 16*snc*, the modifying layer 19 is not included in the uppermost face 16*uu* of the upper graphene layer 16*u*. The modifying layer 19 is not limited to a layer (continuous film), but may be molecules or a monoatomic layer. The modifying group is, for example, oxygen, nitrogen, or boron. The intercalants are impurities doped into the upper graphene layer 16*u* and the side graphene layers 16*s* by intercalation or the like. The intercalants are, for example, halogen, a metal halide, or alkali metal.

Doping intercalants into the graphene layer 16 by intercalation or using modifying groups enables further reduction of the electrical resistance of the graphene layer 16.

The liner layer 13, the mask layer 15, the edge seal layer 17, the face seal layer 18, and the modifying layer 19 may be omitted.

The semiconductor substrate 10 is, for example, a silicon semiconductor substrate. The underlayer 11 is an interlayer insulating layer mainly including silicon oxide, silicon nitride, and an airgap. The contact via 12 is formed of, for example, copper, aluminum, tungsten, or an alloy containing one of more of these elements.

Figure 3:
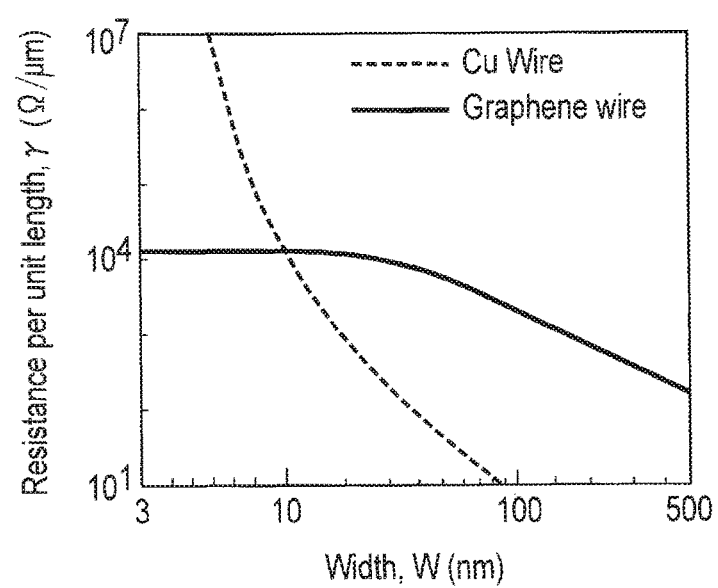
FIG. 3 is a diagram illustrating the relationship between the linewidth of a graphene sheet and electrical resistance.

FIG. 3 is a diagram illustrating the relationship between the electrical resistance ($\gamma\Omega/\mu m$) and the respective widths (Wnm) of the graphene sheet interconnect and the metal interconnect.

As illustrated in FIG. 3, when the width of the graphene sheet interconnect is less than or equal to a predetermined width (for example, 10 nm), the graphene sheet interconnect exhibits a lower electrical resistance than does the metal interconnect (for example, a copper [Cu] interconnect). By contrast, when the graphene sheet interconnect has a width greater than the predetermined width, the graphene sheet interconnect has a higher electrical resistance than does the metal interconnect.

For this reason, the graphene sheet interconnect having a width greater than the predetermined linewidth is preferably cut so as to have a linewidth that is less than or equal to the predetermined linewidth using mask processing or the like. In a thick graphene sheet interconnect, graphene sheet edge faces that do not contact the catalyst layer 14 increases by two faces for each cut.

In the drawings, the graphene layer 16 having a width greater than the predetermined linewidth has four catalyst-noncontacting edge faces 16unc of the upper graphene layer 16u. Specifically, the graphene layer 16 having a width greater than the predetermined linewidth has six catalyst-noncontacting edge faces 16unc and 16snc of the upper graphene layer 16u and the side graphene layers 16s.

In the case of the present example, a plurality of edge faces can be cut out of the graphene layer 16 having a width greater than the predetermined linewidth. For this reason, it is unnecessary to provide a new layer to divide the thick graphene layer 16. The thick graphene layer 16 having a plurality of edge faces has a lower electrical resistance than does a thick graphene layer that does not have a plurality of edge faces.

In any case, the current in the graphene layer 16 flows in the L-direction.

The following is explanation of a method for connecting the graphene layer 16 with the contact via 20 in the case where the mask layer 15 is conductive or no mask layer 15 is provided. Because the catalyst layer 14, the mask layer 15, and the graphene layer 16 are conductive, the contact via 20 can be electrically connected with all the portions of the graphene layer 16.

Figure 4:
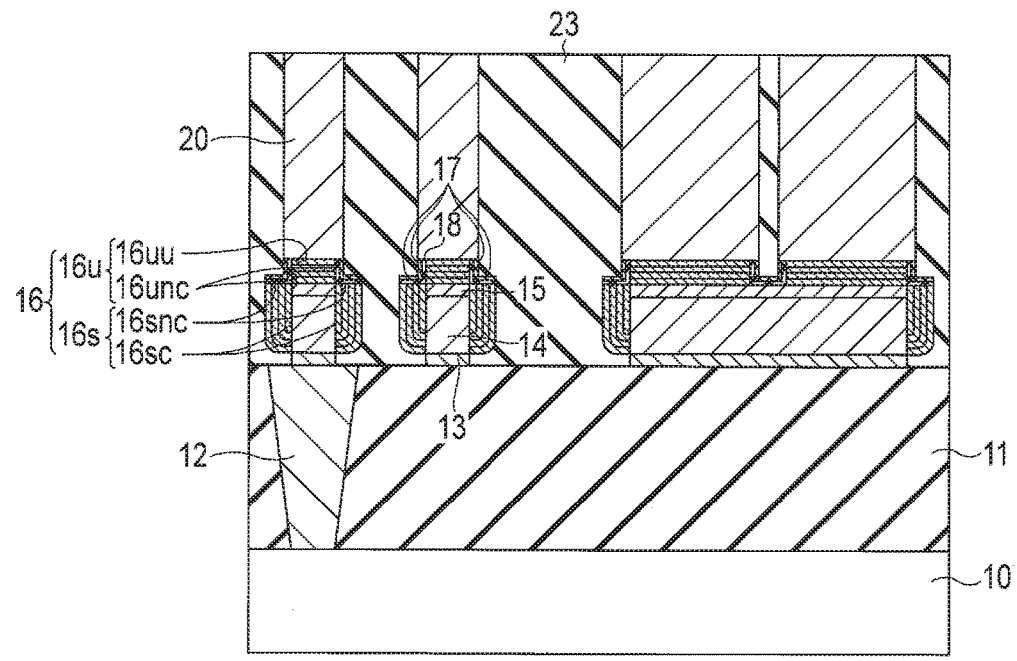
FIGS. 4, 5, 6, and 7 are cross-sectional views illustrating the schematic structures of the semiconductor device according to the first embodiment.

In FIG. 4, each contact via 20 is connected to one face on the uppermost face 16uu of the upper graphene layer 16u (first connection method). The first connection method is advantageous in miniaturization, because the connection area between the contact via 20 and the graphene layer 16 is small.

In the case of FIG. 4, each contact via 20 is not in contact with the catalyst-noncontacting edge faces 16unc and 16snc of the graphene layer 16. However, as described above, because the graphene layer 16 includes a plurality of catalyst-noncontacting edge faces 16unc and 16snc, the graphene layer 16 has a lower electrical resistance than does a graphene layer having no catalyst-noncontacting edge faces 16unc and 16snc.

Figure 5:
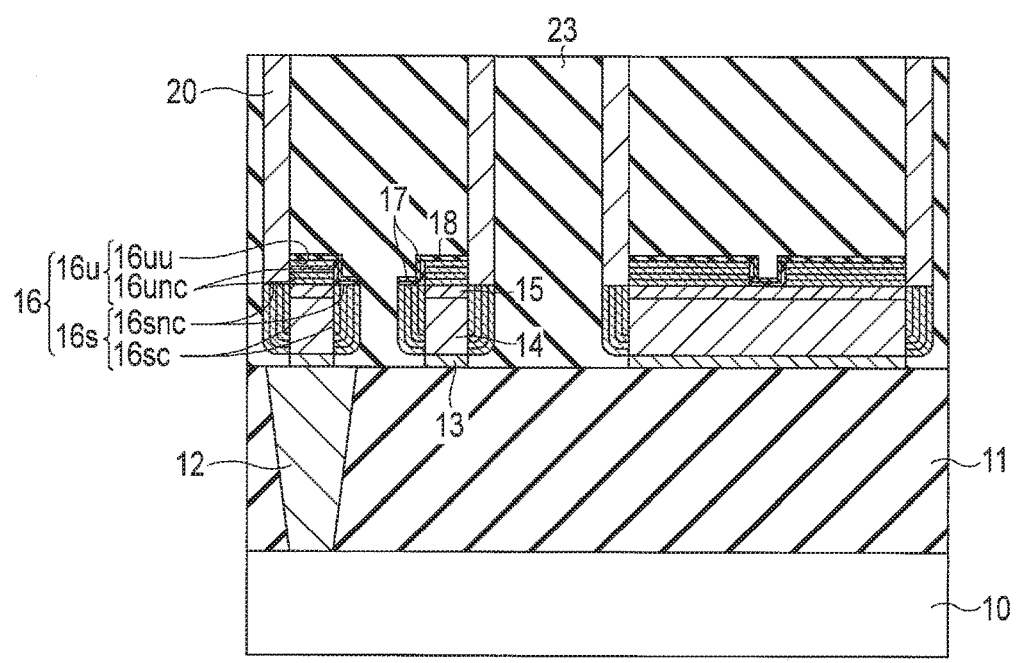

In FIG. 5, each contact via 20 is connected to two faces, that is, one of the two catalyst-noncontacting edge faces 16unc included in the upper graphene layer 16u, and the catalyst-noncontacting edge face 16snc of one side graphene layer 16s (second connection method).

Figure 6:
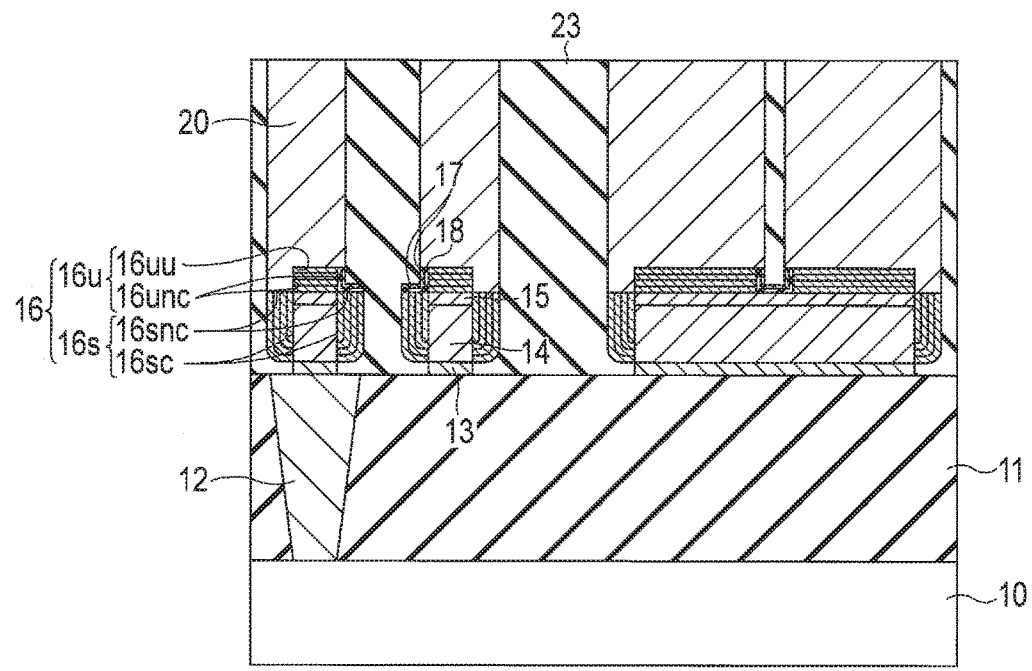

In FIG. 6, each contact via 20 is connected to three faces, that is, the uppermost face 16uu of the upper graphene layer 16u, the catalyst-noncontacting edge face 16unc of the upper graphene layer 16u, and the catalyst-noncontacting edge face 16snc of one side graphene layer 16s (third connection method).

Figure 7:
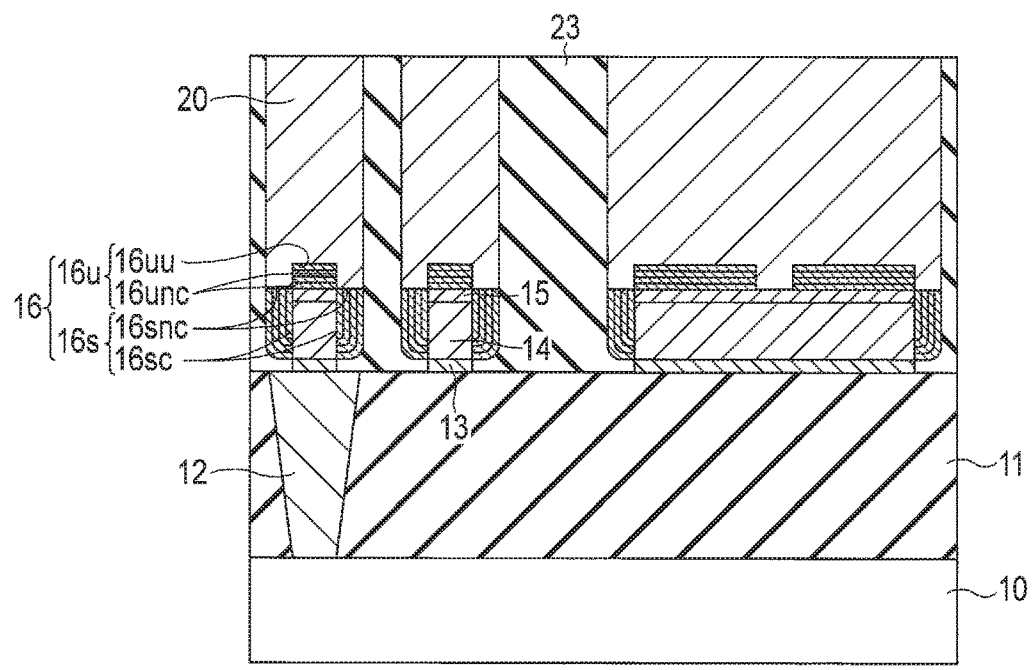

In FIG. 7, each contact via 20 is connected to five faces, that is, the uppermost face 16uu of the upper graphene layer 16u, two catalyst-noncontacting edge faces 16unc of the upper graphene layer 16u, and the catalyst-noncontacting edge faces 16snc of the two side graphene layers 16s. Specifically, the contact via 20 covers the uppermost face 16uu of the upper graphene layer 16u and all the catalyst-noncontacting edge faces 16unc and 16snc included in the graphene layer 16 (fourth connection method).

As described above, edge portions of a graphene sheet have the lowest resistance in the graphene sheet. For this reason, the catalyst-noncontacting edge faces 16unc and 16snc have a lower electrical resistance than does the uppermost face 16uu of the upper graphene layer 16u. Specifically, the electrical resistance decreases as the number of graphene sheets that contact the contact via 20 increases and the number of edges of the graphene sheets that contact the contact via 20 increases.

In the first connection illustrated in FIG. 4, the contact via 20 contacts a face of the uppermost graphene sheet included in the uppermost face 16uu of the upper graphene layer 16u. By contrast, in the second to fourth connections illustrated in FIG. 5 to FIG. 7, the contact via 20 at least contacts edges of a plurality of graphene sheets included in the catalyst-noncontacting edge faces 16unc and 16snc. The second to fourth connection methods achieve lower resistance than that in the first connection method, because each contact via 20 is electrically connected with a plurality of catalyst-noncontacting edge faces 16unc and 16snc. The second to fourth connections achieve a lower electrical resistance than does the first connection, because the second to fourth connections have a greater number of graphene sheets that contact the contact via 20 than does the first connection, and each contact via 20 electrically contacts edges of the respective graphene sheets.

In the third connection illustrated in FIG. 6, each contact via 20 is connected with the catalyst-noncontacting edge face 16unc of the upper graphene layer 16u and the catalyst-noncontacting edge face 16snc of the side graphene layer 16s, in the same manner as the second connection illustrated in FIG. 5. In addition, in the third connection illustrated in FIG. 6, because the contact via 20 is also connected with the uppermost face 16uu of the upper graphene layer 16u, the third connection has a lower electrical resistance than does the second connection.

In the fourth connection illustrated in FIG. 7, the number of edges of graphene sheets that electrically contact the contact via 20 is greater than that in the third connection illustrated in FIG. 6. For this reason, the fourth connection has a lower electrical resistance than does the third connection.

Because the electrical resistance decreases as the electrical connection area between the contact via 20 and the graphene layer 16 increases, the electrical resistance decreases in the order of the first connection method, the second connection method, the third connection method, and the fourth connection method. In addition, because the third and fourth connection methods have larger connection areas between the contact via 20 and the graphene layer 16 than do the first and second connection methods, the third and fourth connection methods enable reduction of the alignment margin failure caused when the contact via 20 is processed. Although the drawings illustrate the state where the face seal layer 17, the edge seal layer 18, and the modifying layer 19 existing between the contact via 20 and the graphene layer 16 are removed, the face seal layer 17, the edge seal layer 18, and the modifying layer 19 are not necessarily removed when they are conductive. Specifically, when the face seal layer 17, the edge seal layer 18, and the modifying layer 19 are conductive, the face seal layer 17, the edge seal layer 18, and the modifying layer 19 may be provided between the contact via 20 and the graphene layer 16.

When the mask layer 15 is insulating, the contact via 20 is required to be connected to both the upper graphene layer 16u and the side graphene layer 16s. In such a case, the graphene layer 16 and the contact via 20 are connected using one of the second to fourth connection methods.

The following is explanation of a method for manufacturing the semiconductor device according to the first embodiment, with reference to FIG. 8 to FIG. 15.

Figure 8:
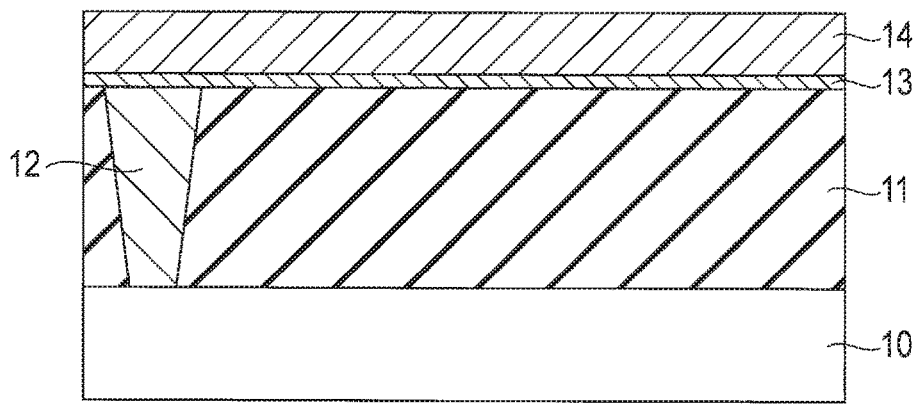
FIGS. 8, 9, 10, 11, 12, 13, 14, and 15 are cross-sectional views illustrating a manufacturing process of the semiconductor device according to the first embodiment.

As illustrated in FIG. 8, an underlayer 11 is formed on a semiconductor substrate 10, a first contact via 12 is embedded and formed in the underlayer 11, a liner layer 13 is formed on the underlayer 11, and a catalyst layer 14 is formed on the liner layer 13.

Figure 9:
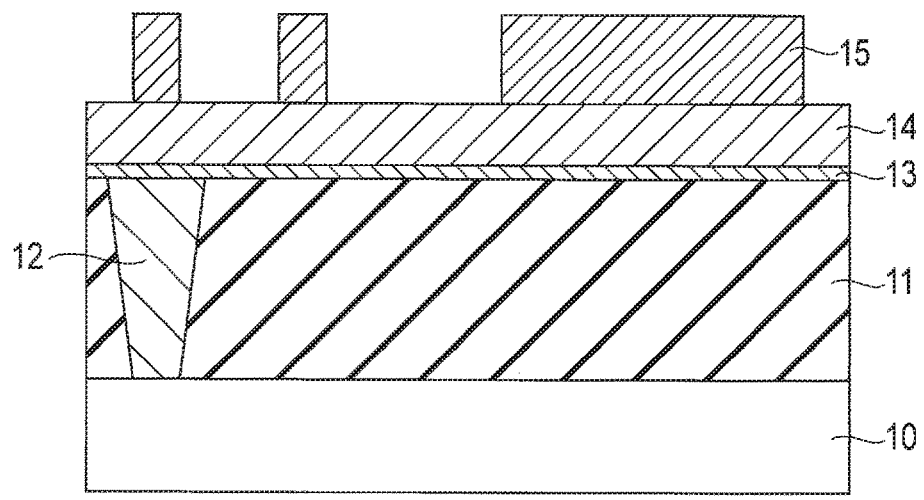

Next, as illustrated in FIG. 9, a pattern of a mask layer 15 is formed on the catalyst layer 14.

Figure 10:
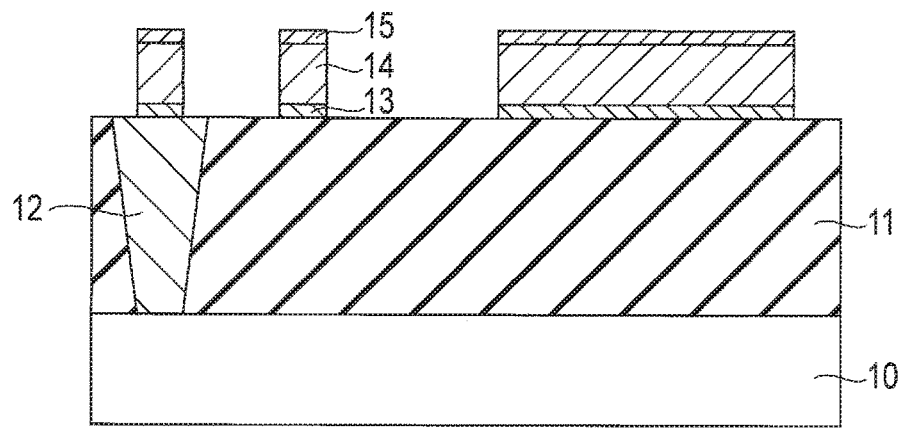

Thereafter, as illustrated in FIG. 10, the liner layer 13 and the catalyst layer 14 are patterned in accordance with the pattern of the mask layer 15 by a processing method such as RIE. In the patterning, the mask layer 15 may be left on the catalyst layer 14, or entirely removed from the catalyst layer 14.

Figure 11:
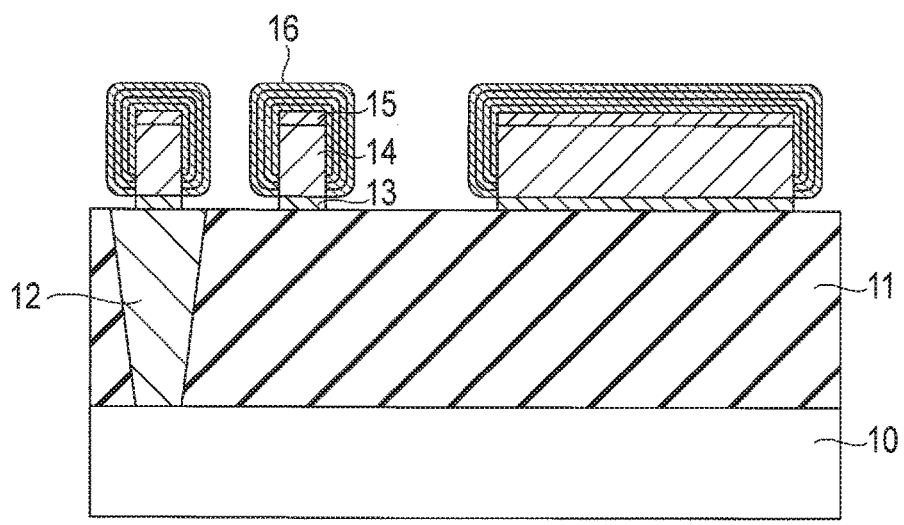

Next, as illustrated in FIG. 11, a graphene layer 16 is formed on the catalyst layer 14. The graphene layer 16 is grown on base points of projections and depressions formed on the face of the catalyst layer 14, in particular, projections and depressions formed on the side faces of the catalyst layer 14.

The innermost single-layer graphene sheet that contacts the catalyst layer 14 is formed along one of side faces extending in the L-direction of the catalyst layer 14 (W2 direction), runs on the upper face of the catalyst layer 14 and the mask layer 15 (W1 direction), and thereafter reaches the other side face of the catalyst layer 14 (W2 direction). Accordingly, the innermost single-layer graphene sheet is grown to roll the catalyst layer 14 and the mask layer 15, with the catalyst layer 14 and the mask layer 15 serving as the axis.

Next, an outer single-layer graphene sheet is grown to cover the innermost single-layer graphene sheet. As described above, growth to cover the inner single-layer graphene sheet with an outer single-layer graphene sheet is repeated, to form the graphene layer 16 surrounding the catalyst layer 14.

During the growth process of the graphene layer 16, single-layer graphene sheets included in each side graphene layer 16s are stacked in the perpendicular direction (W1 direction) on the side face of the catalyst layer 14 extending in the L-direction, and single-layer graphene sheets included in the upper graphene layer 16u are stacked in the height direction (W2 direction) of the catalyst layer 14.

The effect of obstructing growth of graphene sheets increases in the vicinity of the underlayer 11 and the liner layer 13. For this reason, the growth of graphene sheets is finished when growth of the outermost single-layer graphene sheet is obstructed by the underlayer 11 and the liner layer 13.

As described above, the graphene layer 16 is formed to cover the catalyst layer 14 and the mask layer 15.

Alternatively, the graphene layer 16 may be formed to surround the catalyst layer 14 and the mask layer 15.

Alternatively, the graphene layer 16 may be formed to roll the catalyst layer 14 and the mask layer 15 from one side face of the catalyst layer to the other side face thereof, with the catalyst layer 14 and the mask layer 15 serving as axis.

The underlayer (insulating layer) 11 that obstructs growth of the graphene layer 16 is provided in a space with the adjacent catalyst layer 14, to prevent contact between the adjacent graphene layers 16.

Figure 12:
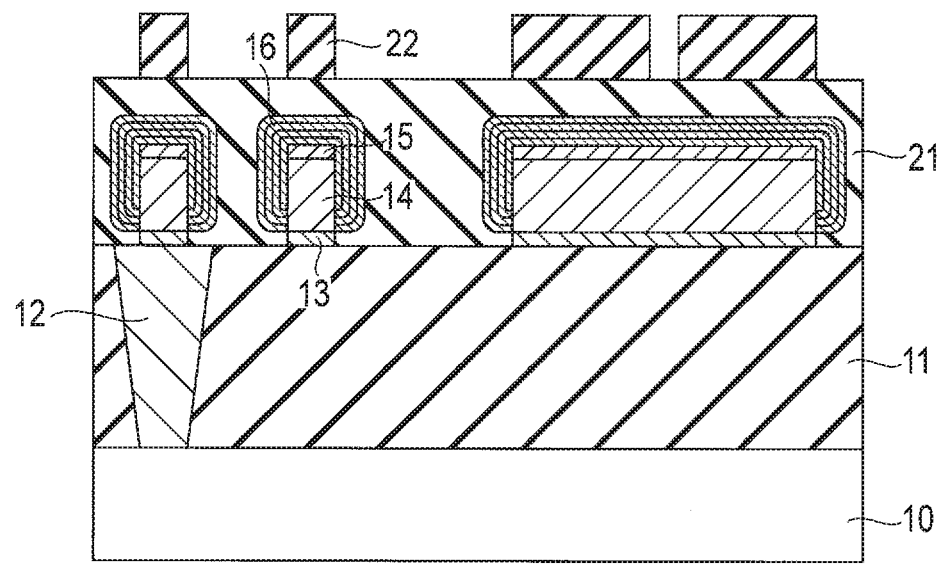

Next, as illustrated in FIG. 12, an insulating layer 21 is formed on the underlayer 11 to cover the graphene layer 16 and the liner layer 13, and a mask pattern 22 is formed on the insulating layer 21. The mask pattern 22 is formed above the catalyst layer 14. In the W1 direction, the width of the mask pattern 22 is preferably substantially equal to the width of the catalyst layer 14 opposed to the mask pattern 22.

Figure 13:
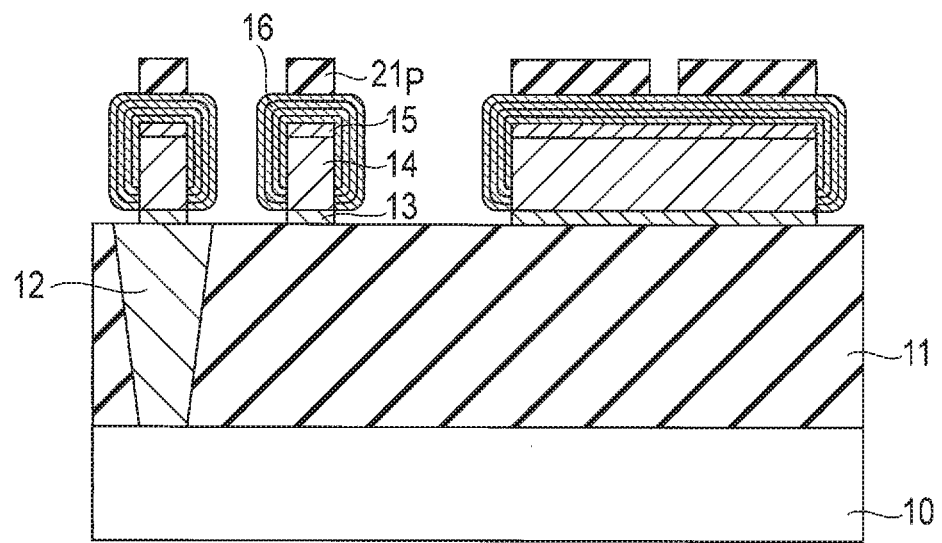

Next, as illustrated in FIG. 13, the insulating layer 21 is patterned along the mask pattern 22 by a processing method such as photolithography, to form an insulating layer pattern 21p. The insulating layer pattern 21p functions as a mask used when the graphene layer 16 is processed. In the W1 direction, the width of the insulating layer pattern 21p is preferably substantially equal to the width of the catalyst layer 14 opposed to the mask pattern 22.

Figure 14:
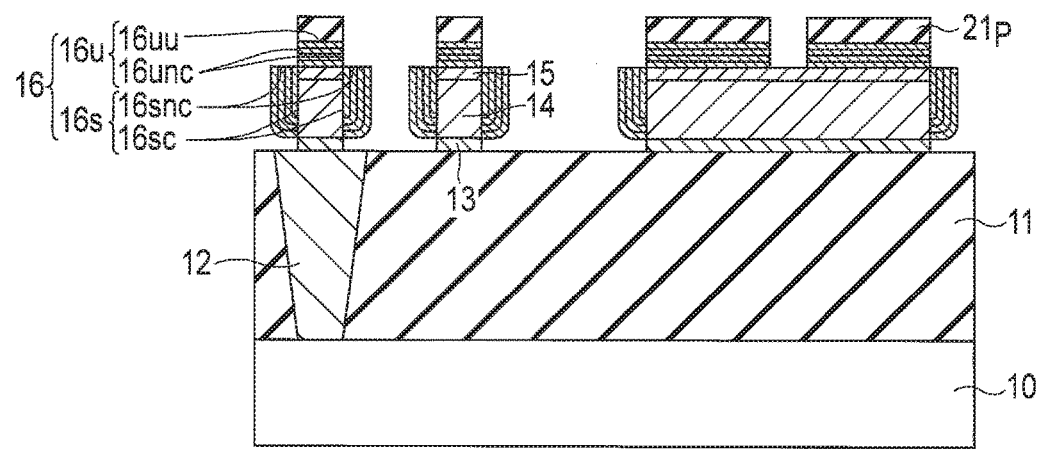

Thereafter, as illustrated in FIG. 14, the graphene layer 16 is processed with the insulating layer pattern 21 serving as a mask. In the processing, part of the graphene layer 16 formed outside the insulating layer pattern 21p, that is, outside the side faces of the catalyst layer 14 extending in the L-direction is cut out.

As described above, at least one upper graphene layer 16u and at least two side graphene layers 16s are formed from one graphene layer 16.

Figure 15:
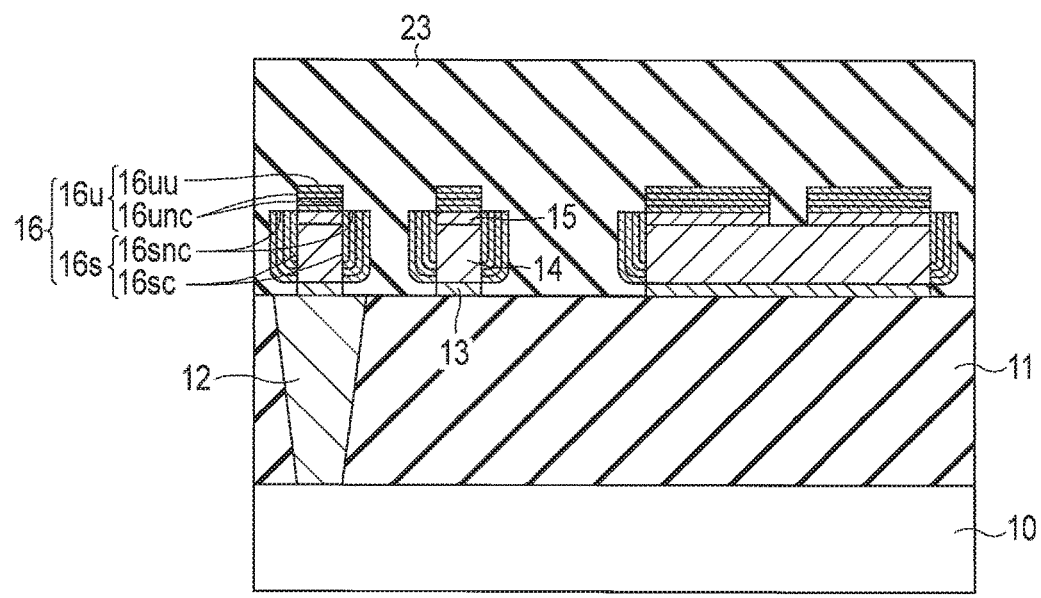

Next, as illustrated in FIG. 15, the insulating layer pattern 21p is removed, and an insulating layer 23 is formed on the underlayer 11, to cover the upper graphene layer 16u, the side graphene layers 16s, and the liner layer 13. A diffusion barrier layer (not illustrated), such as a silicon nitride layer, may be formed between the underlayer 11 and the insulating layer 23, to cover the graphene layer 16 (16u, 16s) and the liner layer 13.

Lastly, the contact via 20 is formed in the insulating layer 23, as illustrated in FIG. 4 to FIG. 7.

As described above, the semiconductor device according to the first embodiment is finished.

In the above manner, according to the first embodiment, four or more catalyst-noncontacting edge faces 16unc and 16snc are cut out from one graphene layer 16. This structure enables the reduction in electrical resistance to be lower than a graphene layer that does not have four or more edge faces. Accordingly, the resistance of the graphene layer 16 can be reduced, regardless of the processing limit or the width of the graphene layer 16.

Second Embodiment

The following is explanation of a second embodiment. The basic structure and the manufacturing method of the present embodiment are the same as those of the first embodiment. Therefore, explanation of the matters explained in the first embodiment is omitted.

Figure 16:
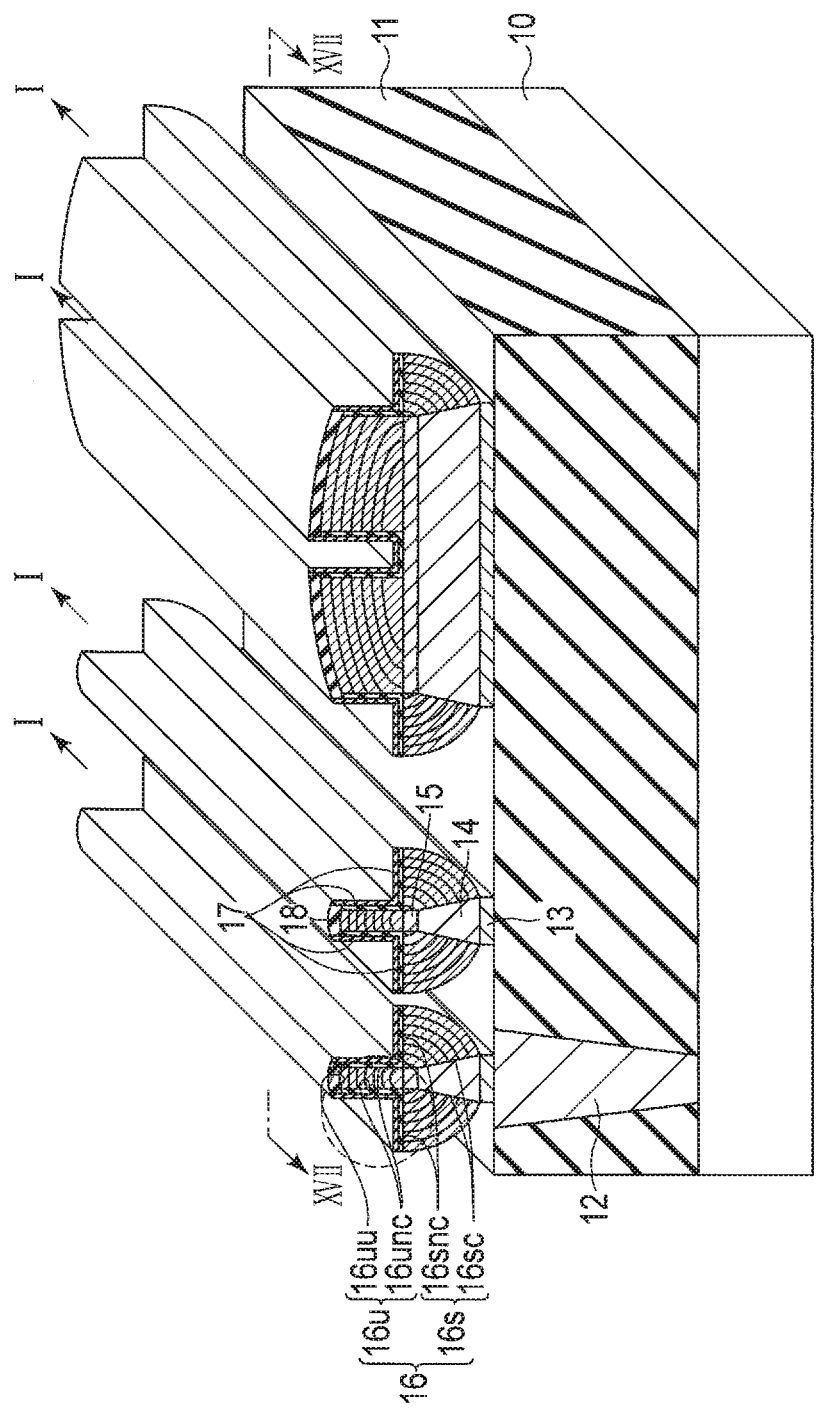
FIG. 16 is a perspective view illustrating a schematic structure of a semiconductor device according to a second embodiment.
Figure 17:
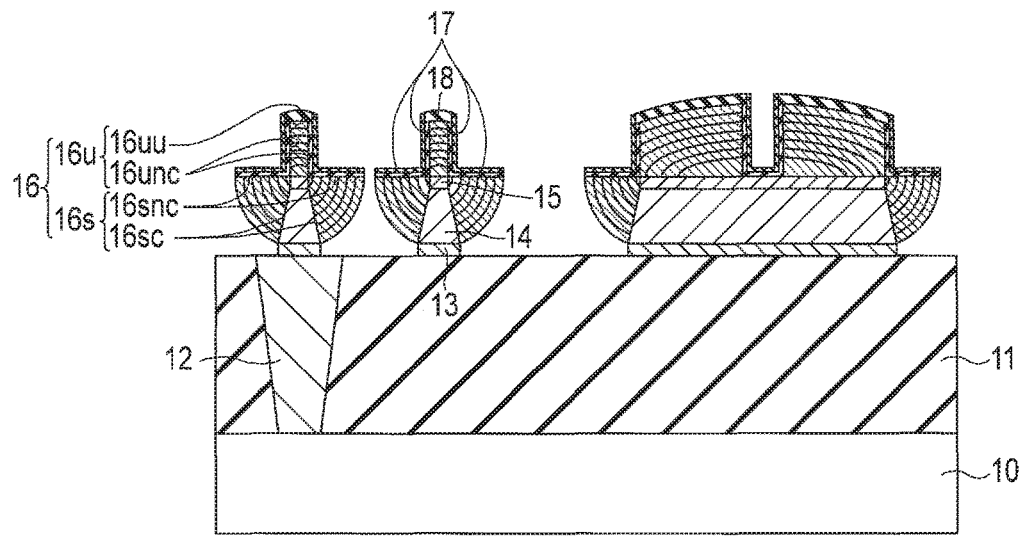
FIG. 17 is a cross-sectional view taken along line XVII-XVII of FIG. 16.
Figure 18:
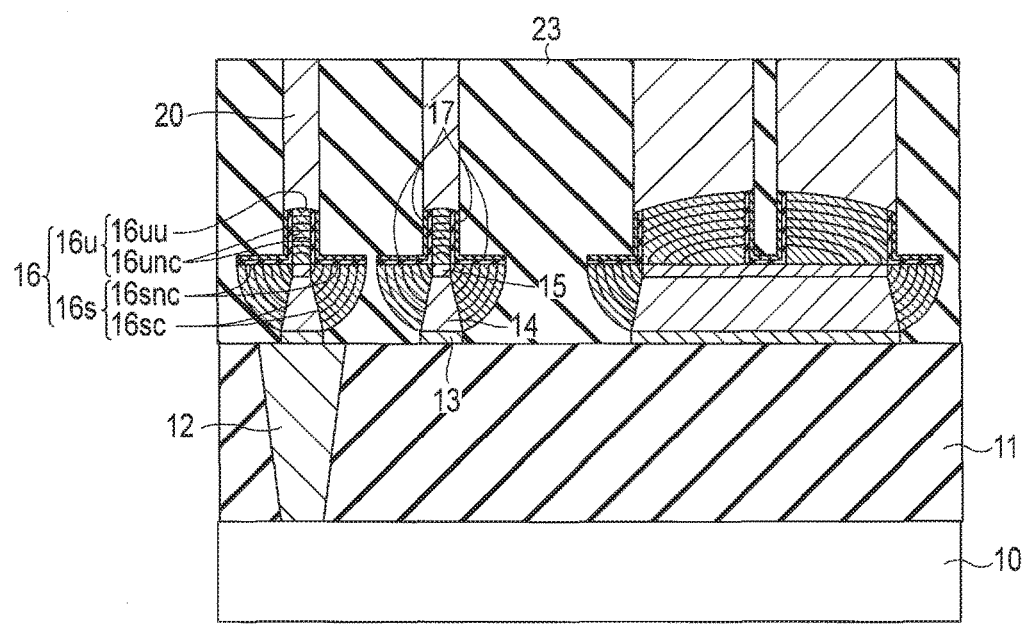
FIGS. 18, 19, 20, and 21 are cross-sectional views illustrating the schematic structures of the semiconductor device according to the second embodiment.

FIG. 16 and FIG. 17 are plan views illustrating a schematic structure of a semiconductor device according to the second embodiment. FIG. 17 is a cross-sectional view taken along line XVII-XVII of FIG. 15.

As illustrated in the drawings, the second embodiment also has the structure in which a graphene layer 16 formed on a catalyst layer 14 includes at least four catalyst-noncontacting edge faces 16unc and 16snc. In addition, the second embodiment has the structure in which a circular graphene layer 16 is formed on a trapezoidal catalyst layer 14. The trapezoidal catalyst layer 14 has a tapered shape, and has an upper face having a width less than that of a bottom face thereof in the W1 direction. Specifically, each of the side faces of the catalyst layer 14 that extend in the L-direction is inclined.

The graphene layer 16 grows to form a circle from one side face of the catalyst layer 14 extending in the L-direction toward the other side face.

Each of single-layer graphene sheets included in each side graphene layer 16s is formed in an arc shape from a catalyst-noncontacting edge face 16snc toward a catalyst-contacting edge face 16sc. Each of single-layer graphene sheets included in an upper graphene layer 16u is formed in an arc shape from one catalyst-noncontacting edge face 16unc toward the other catalyst-contacting edge face 16unc. In the same manner as the first embodiment, the current in the graphene layer 16 flows in the interconnect length direction L.

Figure 19:
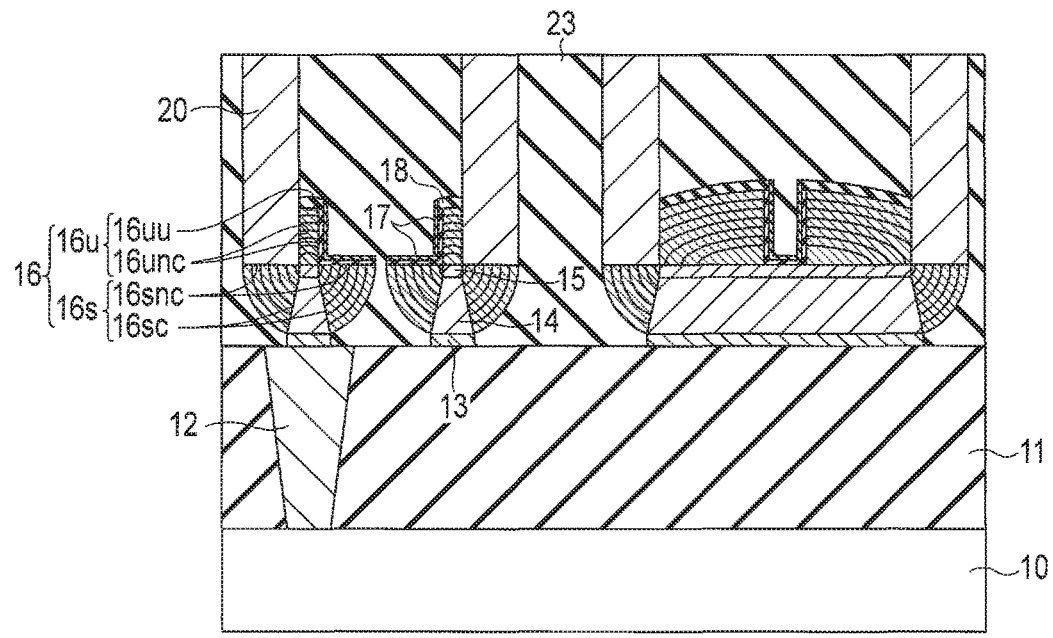
Figure 20:
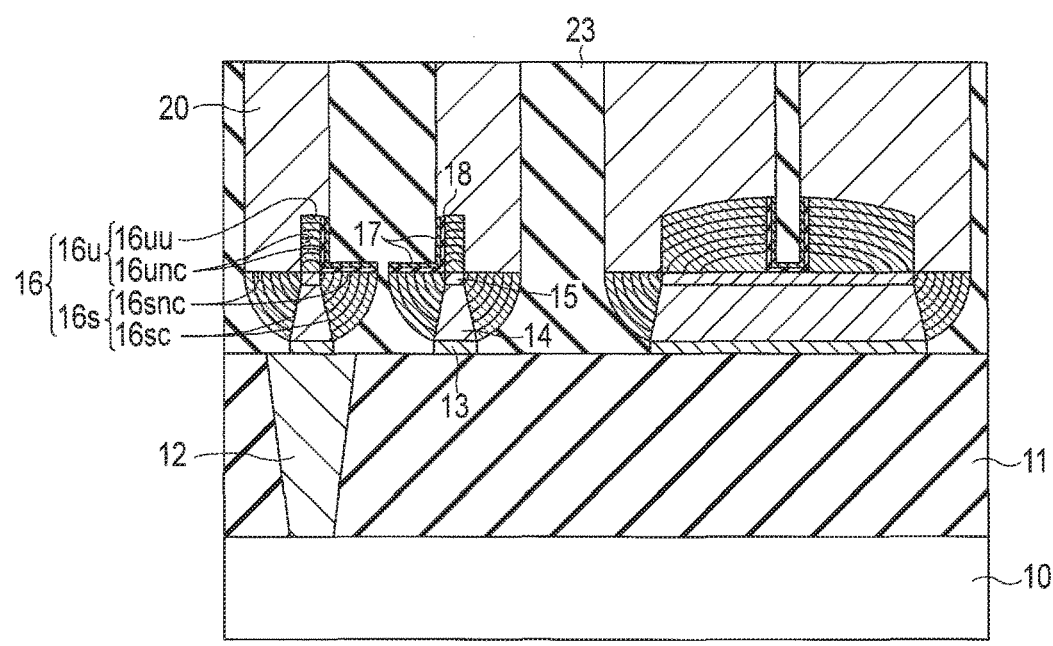
Figure 21:
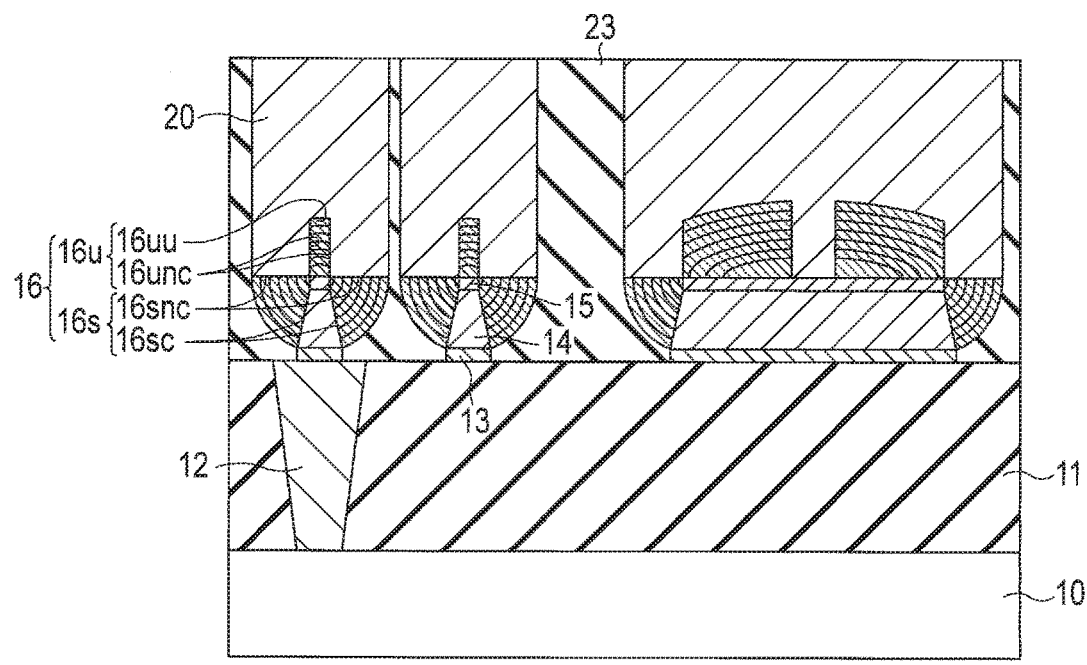

FIG. 18 to FIG. 21 are diagrams illustrating connection relationships between a contact via 20 and the graphene layer 16 according to the second embodiment. In the same manner as in the first embodiment, when the mask layer 15 is conductive or no mask layer 15 is provided, the contact via 20 is connected to the graphene layer 16 using one of first to fourth connection methods (FIG. 18 to FIG. 21). When the mask layer 15 is insulating, the contact via 20 is connected to the graphene layer 16 using one of the second to fourth connection methods (FIG. 19 to FIG. 21).

The manufacturing method according to the second embodiment is the same as that according to the first embodiment, and explanation thereof is omitted.

As described above, the shape of the graphene layer 16 is changed according to the shape of the catalyst layer 14. Examples of the shape of the catalyst layer 14 are a rectangle, a circle, a polygon, a hollow cylinder, and a layered structure.

As described above, the second embodiment produces the same effect as that produced by the first embodiment. In addition, according to the second embodiment, a circular graphene sheet is formed on the trapezoidal catalyst layer 14.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
an underlayer formed on a substrate;
a catalyst layer disposed on the underlayer and extending in an interconnect length direction;
an upper graphene layer formed on an upper face of the catalyst layer; and
side graphene layers provided on two respective side faces of the catalyst layer, the two side faces extending in the interconnect length direction,
wherein:
the upper graphene layer includes two side faces extending in the interconnect length direction, and each of the two side faces of the upper graphene layer includes a catalyst-noncontacting edge face that does not contact the catalyst layer,
an upper face of each of the side graphene layers includes a catalyst-noncontacting edge face that does not contact the catalyst layer, and
a side face that contacts the catalyst layer among side faces of each of the side graphene layers extending in the interconnect length direction includes a catalyst-contacting edge face that contacts the catalyst layer.

2. The device according to claim 1, further comprising:
a liner layer formed between the underlayer and the catalyst layer.

3. The device according to claim 1, further comprising:
a mask layer formed between the catalyst layer and the upper graphene layer.

4. The device according to claim 1, further comprising:
a face seal layer that covers an uppermost face of the upper graphene layer.

5. The device according to claim 1, further comprising:
an edge seal layer provided on at least one of the catalyst-noncontacting edge faces of the upper graphene layer and the catalyst-noncontacting edge face of at least one of the side graphene layers.

6. The device according to claim 1, wherein:
the upper graphene layer includes one of halogen, metal halide, and alkali metal.

7. The device according to claim 1, wherein:
each of the side graphene layers includes one of halogen, metal halide, and alkali metal.

8. The device according to claim 1, further comprising:
a modifying layer provided on at least one of the catalyst-noncontacting edge faces of the upper graphene layer and the catalyst-noncontacting edge face of at least one of the side graphene layers.

9. The device according to claim 8, wherein:
the modifying layer includes a modifying group having one of oxygen, nitrogen, and boron, and the modifying group modifies the catalyst-noncontacting edge face of the upper graphene layer and the catalyst-noncontacting edge face of the side graphene layer.

10. The device according to claim 1, wherein:
the catalyst layer has a pillar shape, the upper face of the catalyst layer has a length that is substantially equal to a length of a bottom face of the catalyst layer in an interconnect width direction, and the two side faces of the catalyst layer are parallel to each other.

11. The device according to claim 1, wherein:
each of the side graphene layers has an L-shape in which a side extending from the catalyst-contacting edge face of the side graphene layer in an interconnect width direction is connected with a side extending from the catalyst-noncontacting edge face of the side graphene layer in an interconnect height direction.

12. The device according to claim 1, wherein:
the catalyst layer has a trapezoidal shape;
a length of the upper face of the catalyst layer is less than a length of a bottom face of the catalyst layer, in an interconnect width direction; and
the two side faces of the catalyst layer are inclined.

13. The device according to claim 1, wherein:
each of the side graphene layers has an arc shape from the catalyst-contacting edge face to the catalyst-noncontacting edge face.

14. The device according to claim 1, further comprising:
a contact via connected to an uppermost face of the upper graphene layer.

15. The device according to claim 1, further comprising:
a contact via connected to the catalyst-noncontacting edge face one of of the side graphene layers and one of the two catalyst-noncontacting edge faces of the upper graphene layer.

16. The device according to claim 1, further comprising:
a contact via connected to an uppermost face of the upper graphene layer, one of the two catalyst-noncontacting edge faces of the upper graphene layer, and the catalyst-noncontacting edge face of one of the two side graphene layers.

17. The device according to claim 1, further comprising:
a contact via connected to an uppermost face of the upper graphene layer, and all of the catalyst-noncontacting edge faces of the upper graphene layer and the side graphene layers.

* * * * *